United States Patent
Sanchez et al.

(10) Patent No.: US 12,185,487 B2
(45) Date of Patent: Dec. 31, 2024

(54) SEALED SCREWS FOR SEALED ELECTRONIC CONTROL MODULES

(71) Applicant: VEONEER US SAFETY SYSTEMS, LLC, Southfield, MI (US)

(72) Inventors: Luis Fernando Sanchez, Commerce Township, MI (US); Demetri Stilianos, Howell, MI (US)

(73) Assignee: VEONEER US SAFETY SYSTEMS, LLC, Southfield, MI (US)

( * ) Notice: Subject to any disclaimer, the term of this patent is extended or adjusted under 35 U.S.C. 154(b) by 0 days.

(21) Appl. No.: 18/123,107

(22) Filed: Mar. 17, 2023

(65) Prior Publication Data

US 2024/0314957 A1   Sep. 19, 2024

(51) Int. Cl.
*H05K 5/00* (2006.01)
*H05K 5/06* (2006.01)

(52) U.S. Cl.
CPC ........... *H05K 5/061* (2013.01); *H05K 5/0008* (2013.01); *H05K 5/0095* (2013.01); *H05K 5/06* (2013.01)

(58) Field of Classification Search
CPC .... H05K 5/061; H05K 5/0008; H05K 5/0095; H05K 5/06

USPC .......................................................... 361/728
See application file for complete search history.

(56) References Cited

U.S. PATENT DOCUMENTS

| | | | | |
|---|---|---|---|---|
| 2013/0328461 | A1* | 12/2013 | Chung | H05K 5/0221 |
| | | | | 403/361 |
| 2017/0290173 | A1* | 10/2017 | Shoji | H05K 5/03 |
| 2019/0067924 | A1* | 2/2019 | Aichi | H05K 5/0056 |
| 2019/0289728 | A1* | 9/2019 | Malecke | H05K 5/0004 |

* cited by examiner

Primary Examiner — Zhengfu J Feng
(74) Attorney, Agent, or Firm — DICKINSON WRIGHT PLLC

(57) ABSTRACT

An apparatus includes an upper housing, a gasket, a lower housing, and a plurality of sealed threaded fasteners. The upper housing generally comprises a plurality of threaded sockets. The lower housing generally comprises a plurality of holes configured to align with the plurality of threaded sockets when assembled to the upper housing. When the upper housing and gasket are assembled to the lower housing, the sealed threaded fasteners are screwed into the threaded sockets of the upper housing through the holes in the lower housing, applying an amount of compressive force to the gasket and sealing the holes in the lower housing.

18 Claims, 9 Drawing Sheets

SEALED SCREWS FOR SEALED ELECTRONIC CONTROL MODULES

FIELD OF THE INVENTION

The invention relates to automotive control assemblies generally and, more particularly, to a method and/or apparatus for implementing sealed screws for sealed electronic control modules.

BACKGROUND

The automotive industry requires a restraint control module (RCM) be sealed to the environment in some applications. International Electrotechnical Commission (IEC) standard 60529, Degrees of Protection Provided by Enclosures (IP Codes), Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of 1 meter for 30 minutes (e.g., IP 67/68). In some applications customers require sealing to pressures up to 6 psi (e.g., IP 68). In some cases the pressure differential is created due to a customer requirement to preheat the module to 85° C. prior to conducting the water spray or immersion testing.

The sealed modules are assembled using threaded fasteners (e.g., screws). A seal needs to be formed between the screws and a housing of the sealed module. The seal can come from the screws having an applied sealant or by a secondary sealing operation. The screws with sealant applied typically have a soft material under the head of the screw. The soft material is typically compressed during an assembly operation, which seals the module. If a very soft sealing material is used, the material under the head of the screw can be torn during the assembly process and only a small amount of the material within the screw hole provides the seal between the housing and the screw. If a hard non-metallic sealing material is used, the hard material remains in place under the head of the screw. However, since plastics relax over time and temperature, the hard non-metallic sealing material can lose clamping force. The loss of clamping force can result in failure of the seal.

It would be desirable to implement sealed screws for sealed electronic control modules.

SUMMARY

The invention concerns an apparatus comprising an upper housing, a gasket, a lower housing, and a plurality of sealed threaded fasteners. The upper housing generally comprises a plurality of threaded sockets. The lower housing generally comprises a plurality of holes configured to align with the plurality of threaded sockets when assembled to the upper housing. When the upper housing and gasket are assembled to the lower housing, the sealed threaded fasteners are screwed into the threaded sockets of the upper housing through the holes in the lower housing, applying an amount of compressive force to the gasket and sealing the holes in the lower housing.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing sealed screws for sealed electronic control modules that may (i) utilize sealed threaded fasteners comprising a compression limiting feature to secure case halves to one another to provide a secure seal, (ii) meet automotive standards for sealing control modules against fluid penetration (e.g., IP 67/68), (iii) integrate a sealing material on a threaded fastener, (iv) limit compression of an integrated sealing material using an integrated compression limiter, (v) eliminate loss of clamp-load between screw and substrate over time, (vi) prevent soft sealant material from being removed during assembly operations, (vii) prevent sealant material from being crushed during assembly operations, (viii) provide redundant sealing surfaces, and/or (ix) be implemented in any control module case comprising two halves.

Figure 1:
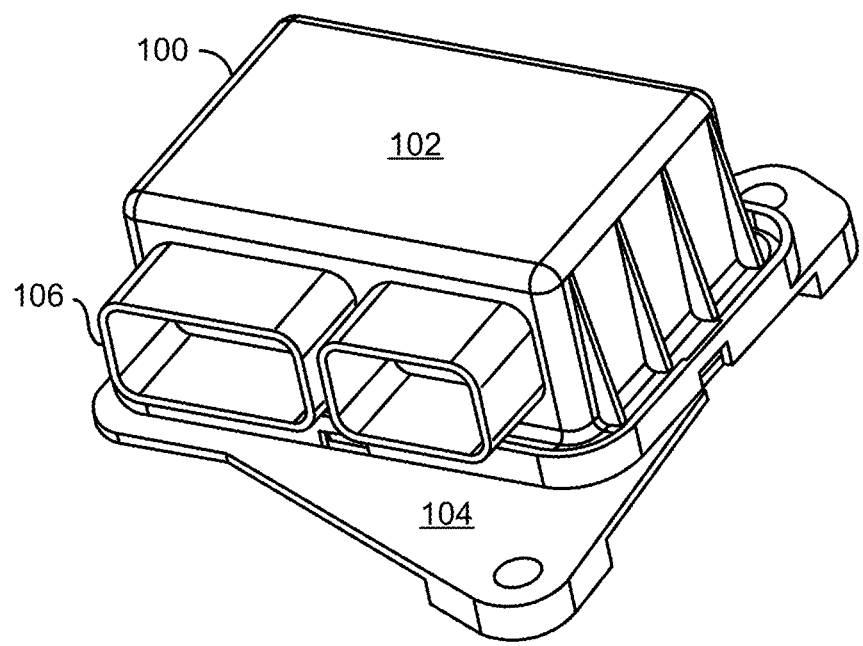
FIG. 1 is a diagram illustrating a perspective view of an upper surface of an assembled sealed electronic control module housing in accordance with an example embodiment of the invention.

Referring to FIG. 1, a diagram is shown illustrating a perspective view of an upper surface of an assembled sealed electronic control module housing 100 in accordance with an example embodiment of the invention. In various embodiments, the housing (or enclosure) 100 comprises an upper housing 102 and a lower housing (or cover or baseplate) 104. In various embodiments, the upper housing 102 generally comprises a plastic or resin based material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. In various embodiments, the upper housing 102 may include one or more connectors 106. In some embodiments, connectors may be omitted from the upper housing 102. In an example, the one or more connectors 106 may be implemented as a separate connector subassembly attached to the upper housing 102. In an example, the connector subassembly may be sealed to the upper housing 102 using one or more of a sealant material, an epoxy, laser welding, and vibration welding. In an example, the one or more connectors 106 may be integrated into the upper housing 102. Molding or otherwise incorporating the connectors as part of the enclosure (housing) generally eliminates a need for sealing the connector/housing interface. In an example, the upper housing 102 may incorporate a 72 pin connector and a 52 pin connector to provide electrical connections to a circuit board sealed within the enclosure 100. In an example, the 72 pin and 52 pin connectors may be implemented as 1.8 mm pitch Nano connectors. In an example, the enclosure 100 and the enclosed circuit board may implement a sealed restraint control module (RCM) that may meet international standards for intrusion protection (e.g., an IP 67 Intrusion Protection Rating as specified in International Electrotechnical Commission (IEC) standard 60529).

Figure 2:
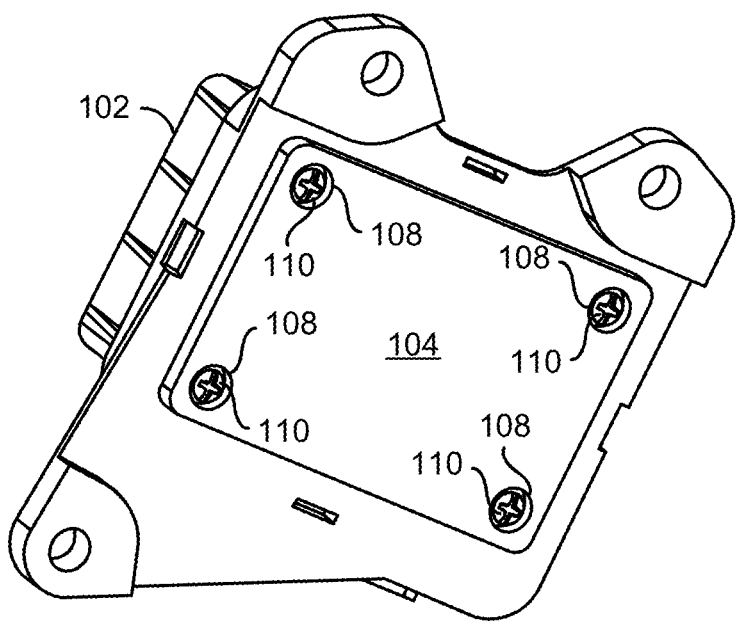
FIG. 2 is a diagram illustrating a perspective view of a lower surface of the assembled sealed electronic control module housing of FIG. 1.

Referring to FIG. 2, a diagram is shown illustrating a perspective view of a lower surface of the assembled sealed electronic control module housing 100 of FIG. 1. In various embodiments, the lower housing 104 may be implemented using a metal or metal-alloy material, or a plastic or resin-based material similar to the upper housing 102. In an example, the lower housing 104 may be implemented as an electrically conductive baseplate. The lower housing 104 is generally configured to provide mechanical support, thermal cooling, and/or electrical grounding for the sealed electronic control module housing 100. In an example, the lower housing (or cover or baseplate) 104 may be implemented as a die cast Aluminum baseplate. In another example, the lower housing (or cover or baseplate) 104 may be implemented as a stamped steel baseplate. Implementing the lower housing 104 with a metallic material may aid in dissipating heat generated by circuitry within the seated enclosure 100. However, other materials may be utilized to implement the lower housing 104.

In various embodiments, the lower housing 104 may be machined to create a sealing surface against which a gasket placed between the upper housing 102 and the lower housing 104 may form a seal when the upper housing 102 and the lower housing 104 are pressed together. The lower housing 104 is generally configured to provide a mounting footprint for the sealed electronic control module housing 100. In an example, the lower housing 104 may be implemented with a mounting footprint that simplifies testing. However, other footprints may be implemented to meet the design criteria of a particular application.

In various embodiments, the lower housing (or cover or baseplate) 104 comprises a plurality of holes 108 through which sealed threaded fasteners (e.g., bolts, machine screws, self-threading screws, etc.) 110, implemented in accordance with an embodiment of the invention, may be inserted to securely assemble and seal the upper housing 102 to the lower housing 104. In various embodiments, a predefined amount of torque may be applied to the sealed threaded fasteners 110 to perfect a specified clamping force on a sealing gasket disposed between the upper housing 102 and the lower housing 104.

In various embodiments, a molded elastomer gasket may be utilized to create the seal between the upper housing 102 and the lower housing 104 of an electronic control module housing 100. In some embodiments, the gasket may be comprised of nitrile rubber. In some embodiments, the gasket may comprise silicone rubber. In an example embodiment, the gasket may comprise a material having a durometer rating in a range from 30 to 100 Shore A. However, other materials may used to meet the design criteria of a particular implementation. In some embodiments, the gasket may be implemented as an individual component. In some embodiments, the gasket may comprise a circular cross-section. In some embodiments, the gasket may comprise an L-shaped cross-section. In some embodiments, the seal may be implemented as an elastomer gasket that is over-molded to an adjacent component (e.g., housing, cover, etc).

In various embodiments, the sealed threaded fasteners 110 comprise a compression limiting feature (e.g., a plurality of posts, a continuous 360 degree rib, etc.) and an integrated sealant material. In an example, the sealed threaded fasteners 110 may be tightened (torqued) to cause the compression limiting feature to contact the lower housing 104 and provide a predetermined clamping force. In an example, the compression limiting feature prevents the torque being applied to the sealed threaded fasteners 110 from shearing (tearing) the integrated sealant. In an example, a clamping force ranging from about one kilonewton (kN) to about fifteen kNs per screw may be implemented. However, the particular clamp load and torque may vary depending on the specifications of the sealed threaded fasteners 110. In various embodiments, the compression limiting feature generally allows the sealed threaded fasteners 110 to be tightened (torqued) without distorting or destroying the integrated sealant material within a perimeter of the compression limiting feature.

Figure 3:
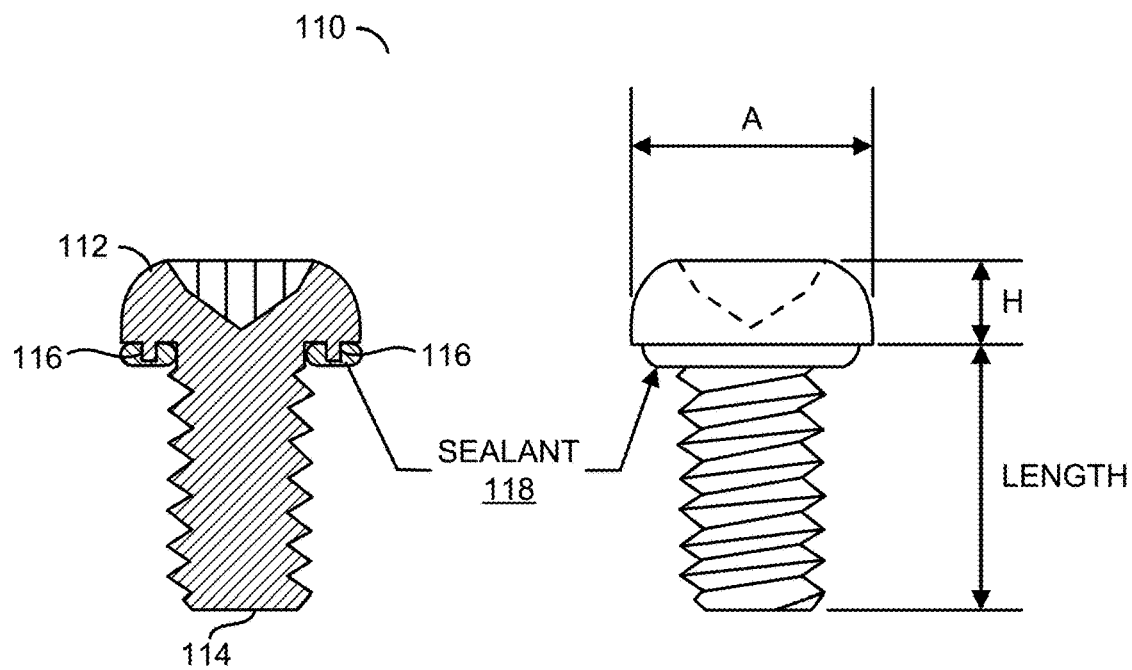
FIG. 3 is a diagram illustrating features of a sealed screw fastener in accordance with an example embodiment of the invention.

Referring to FIG. 3, a diagram is shown illustrating features of the sealed threaded fasteners 110 in accordance with an example embodiment of the invention. In an example, the sealed threaded fastener 110 may be implemented as a pan head machine screw. In an example, the sealed threaded fasteners 110 may comprise an M3.5×13 Phillips pan head self-sealing screw. In various embodiments, the sealed threaded fasteners 110 may comprise a head 112, a threaded shaft (or shank) 114 extending perpendicular and away from the head 112, a compression limiting feature comprising a plurality of posts 116 extending away from the head 112 and parallel with the threaded shaft 114, and an integrated sealant material 118 applied to the head 112 and encompassing the threaded shaft 114 and the plurality of posts 116. The plurality of posts 116 generally prevent the sealing material 118 applied to the heads 112 of the sealed threaded fasteners 110 from being torn (sheared) away while the sealed threaded fasteners 110 are tightened (torqued).

In an example, a height (H) of the head 112 of the sealed threaded fasteners 110 may be configured to be flush with an outside surface of the lower housing 104. In another example, the head 112 of the sealed threaded fasteners 110 may extend above the outside surface of the lower housing 104. In an example, a length of the threaded shaft 114 of the sealed threaded fasteners 110 is generally configured to ensure a sufficient quantity of threads are in the upper housing 102 to provide a desired holding force. In an example, a height of the posts 116 is generally similar to or less than a thickness of the sealant material 118 applied to the head 112 of the sealed threaded fasteners 110. In an example, the posts 116 may be implemented as about 0.35 millimeters (mm) tall. In an example, the sealant material 118 may comprise an inert sealing technology (e.g., SEALTEK or PLASTISOL available from ND Industries in Clawson, MI).

Figure 4:
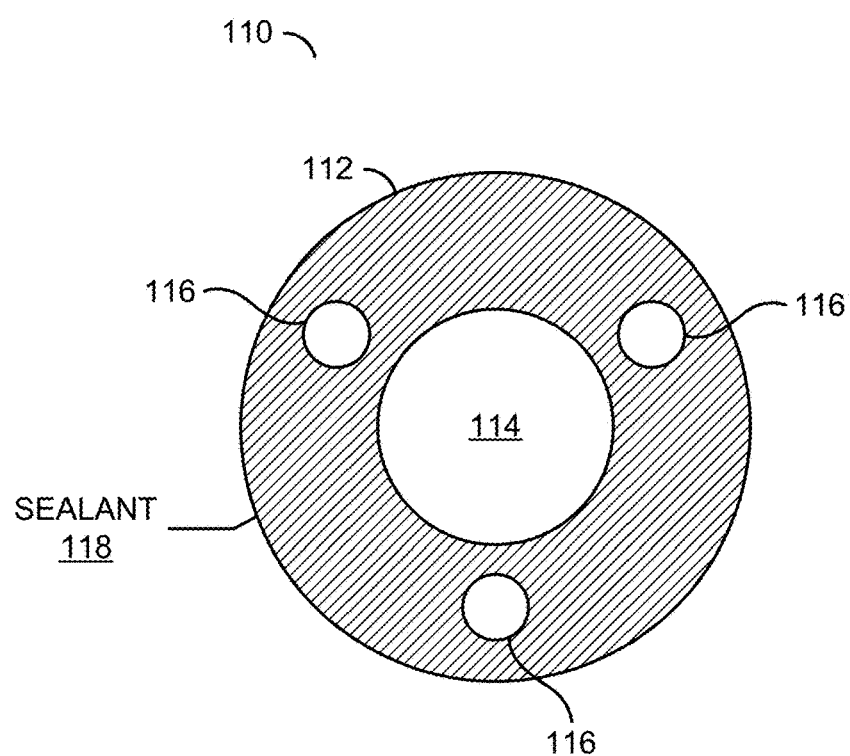
FIG. 4 is a diagram illustrating features of the sealed screw fastener of FIG. 3.

Referring to FIG. 4, a diagram is shown illustrating an example implementation of the sealed threaded fasteners 110 in accordance with an example embodiment of the invention. In an example, the sealed threaded fasteners 110 may be implemented having three posts 116. In an example, the posts 116 may be arranged at points between an outer edge of the head 112 and the threaded shaft 114 of the sealed threaded fastener 110. In an example, the posts 116 may be arranged equally spaced/distributed around the head 112 of the sealed threaded fastener 110. However, positions other than symmetrical may be implemented. In an example, the posts 116 may be implemented having a circular cross-section. However, other cross-section shapes may be used. In an example, ends of the posts 116 may have a profile that avoids cutting into or otherwise marring a surface of the lower housing 104.

Figure 5:
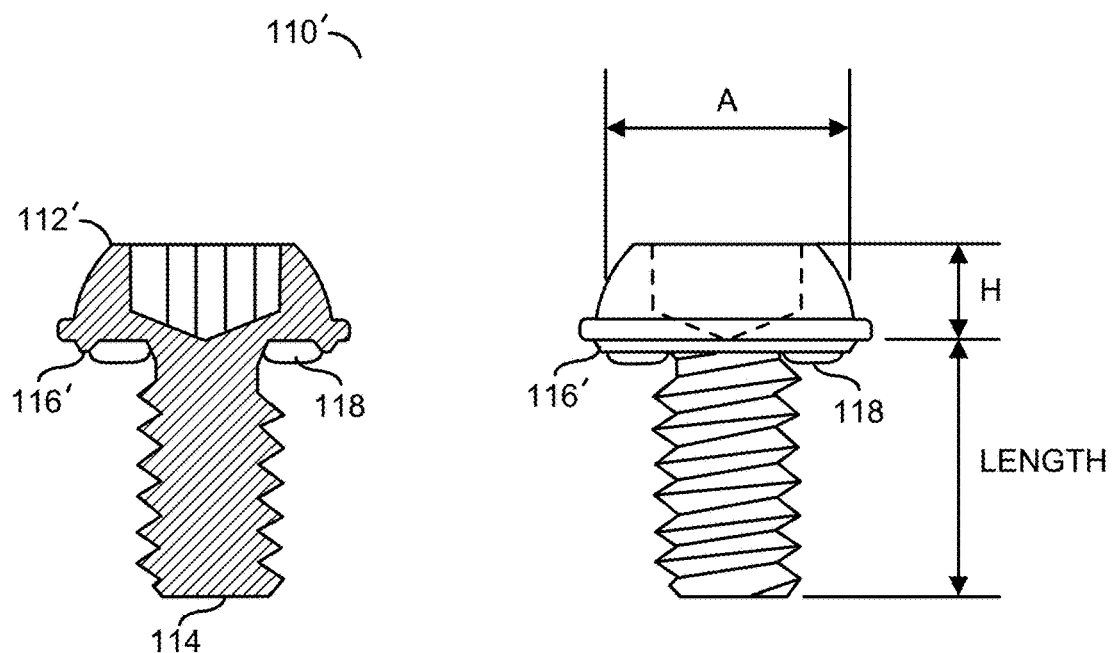
FIG. 5 is a diagram illustrating features of a sealed screw fastener in accordance with another example embodiment of the invention.

Referring to FIG. 5, a diagram is shown illustrating features of the sealed threaded fasteners 110 in accordance with another example embodiment of the invention. In an example, a sealed threaded fastener 110' may be implemented as a pan head machine screw with a compression limiting feature and integrated sealant material. In an example, the sealed threaded fasteners 110' may comprise an M3.5×13 Phillips pan head self-sealing screw. In various embodiments, the sealed threaded fasteners 110' may comprise a head 112', a threaded shaft (or shank) 114 extending perpendicular and away from the head 112', a compression limiting feature comprising a continuous 360 degree rib 116' extending away from the head 112' and parallel with the threaded shaft 114, and the sealant material 118 applied to the head 112' between the threaded shaft 114 and the continuous 360 degree rib 116'. The continuous 360 degree rib 116' generally prevents the sealing material 118 applied to the heads 112' of the sealed threaded fasteners 110' from being torn away while the sealed threaded fasteners 110' are tightened (torqued). In various embodiments, the continuous 360 degree rib 116' generally allows the sealed threaded fasteners 110 to be tightened (torqued) without distorting or destroying the integrated sealing material 118 within a perimeter of the continuous 360 degree rib 116'.

In an example, a height (H) of the head 112' of the sealed threaded fasteners 110' may be configured to be flush with an outside surface of the lower housing 104. In another example, the head 112' of the sealed threaded fasteners 110' may extend above the outside surface of the lower housing 104. In an example, a length of the threaded shaft 114 of the sealed threaded fasteners 110' is generally configured to ensure a sufficient quantity of threads are in the upper housing 102 to provide a desired holding force. A thickness of the sealant material 118 applied to underside of the head 112' of the sealed threaded fasteners 110' is generally greater than a height of the continuous 360 degree rib 116'. In an example, the continuous 360 degree rib 116' may have a profile that avoids cutting into or otherwise marring a surface of the lower housing 104, while maximizing the compressive force applied when torqued to a specified amount.

In an example, the continuous 360 degree rib 116' is generally configured to compress the sealant 118 against the lower housing 104. As the sealant expands in response to the compression, the continuous 360 degree rib 116' generally deflects a first portion of the expanding sealant 118 within the continuous 360 degree rib 116' toward the threaded shaft 114 and pushes a second portion of the sealant 118 expanding outside the continuous 360 degree rib 116' away from a point of contact between the continuous 360 degree rib 116' and the surface of the lower housing 104. In an example, the continuous 360 degree rib 116' may have a contour (or cross-section) similar to a bow (or prow) of a boat to deflect the sealant material 118 to either side of the point (line) of contact between the continuous 360 degree rib 116' and the surface of the lower housing 104. In an example, the contour (or cross-section) may be similar to a normal distribution curve (e.g. second order, parabolic, etc.). In an example, the compression of the sealant 118 toward the threaded shaft 114 seals the hole 108 in the lower housing 104, while avoiding a need for additional curing or heating steps to perfect the seal.

Figure 6:
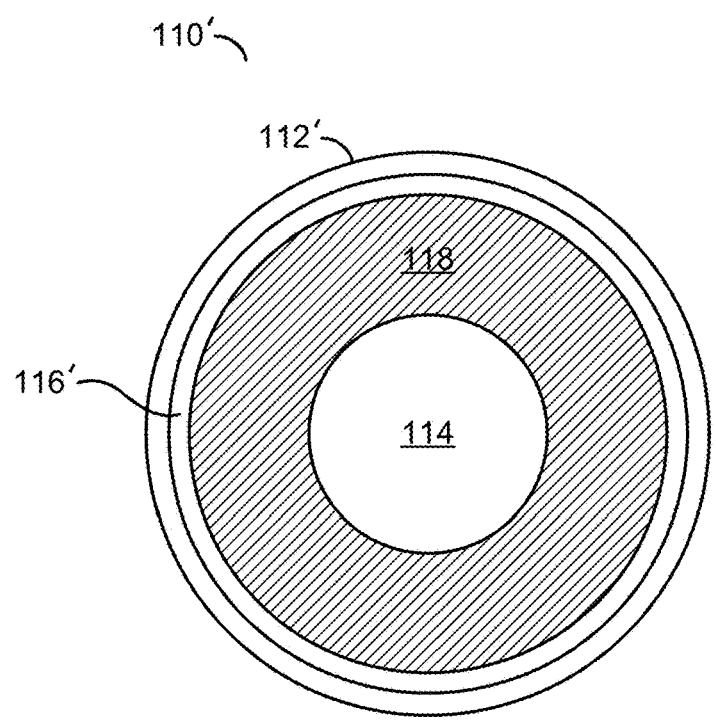
FIG. 6 is a diagram illustrating features of the sealed screw fastener of FIG. 5.

Referring to FIG. 6, a diagram is shown illustrating an example implementation of the sealed threaded fasteners 110' in accordance with another example embodiment of the invention. In an example, the sealed threaded fasteners 110' may be implemented having the continuous 360 degree rib 116'. The continuous 360 degree rib 116' is generally arranged to form an annular ring (or ridge) around the threaded shafts 114. The continuous 360 degree rib 116' is generally arranged a distance between the continuous 360 degree rib 116' and an outer edge of the head 112' is less than or equal to a distance between the continuous 360 degree rib 116' and the threaded shaft 114 of the sealed threaded fasteners 110'.

Figure 7:
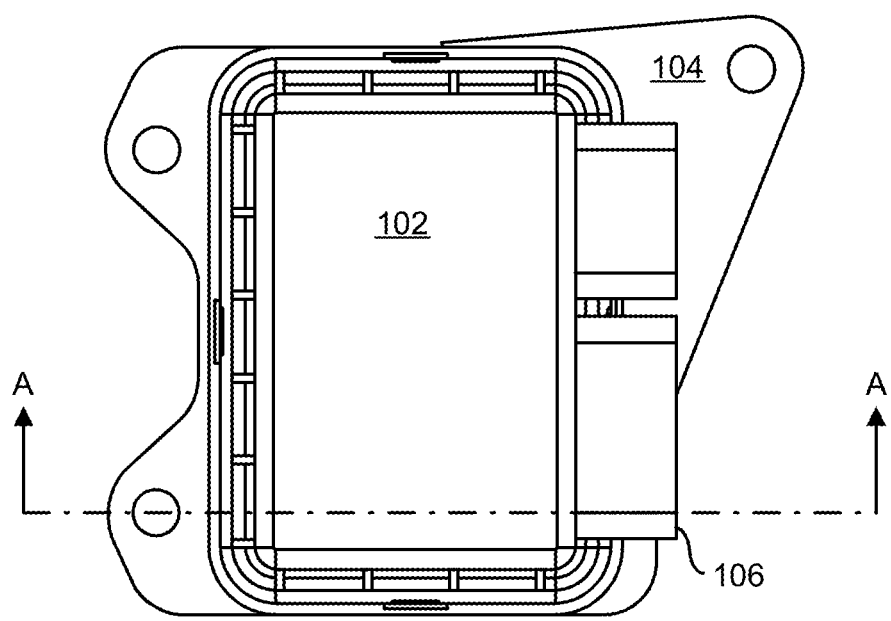
FIG. 7 is a diagram illustrating a top view of the assembled sealed electronic control module housing of FIG. 1.

Referring to FIG. 7, a diagram is shown illustrating a top view of the assembled sealed electronic control module housing 100 of FIG. 1. In an example, the upper housing 102 may have four side faces. In an example, one or more of the side faces may contain one or more connectors 106. In an example, the one or more connectors 106 may be integrated (e.g., molded-in) to the upper housing 102. In another example, the one or more connectors 106 may assembled and sealed to the upper housing 102 to reduce costs.

Figure 8:
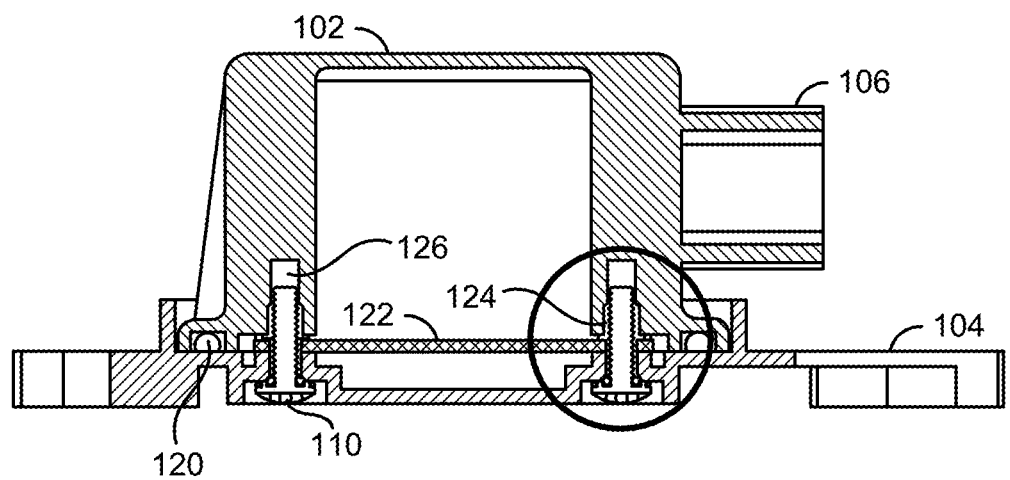
FIG. 8 is a cross-sectional view illustrating a section of the sealed electronic control module housing of FIG. 7 in accordance with an example embodiment of the invention.
Figure 9:
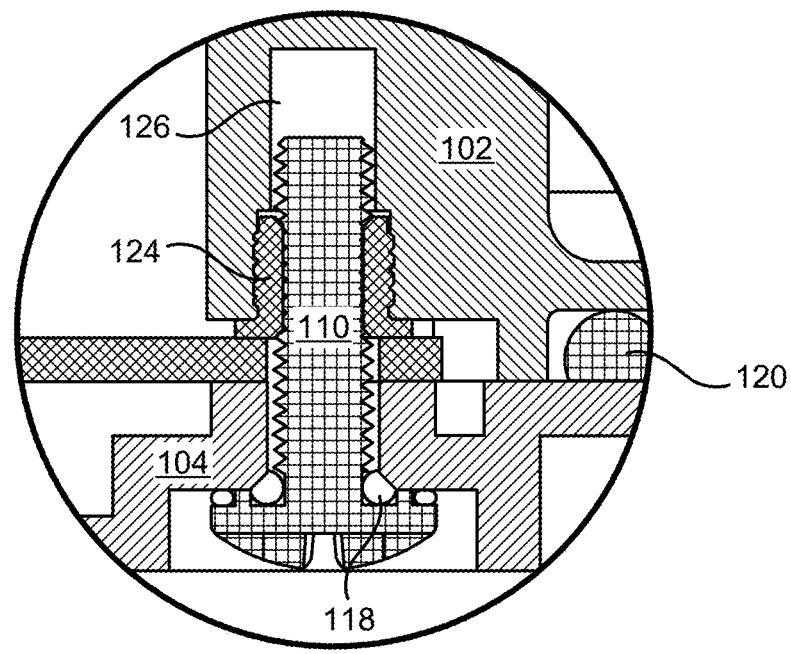
FIG. 9 is a diagram illustrating an enlarged view of a screw fastener feature of the assembled sealed electronic control module housing of FIG. 8.

Referring to FIGS. 8 and 9, a cross-sectional view is shown illustrating a section A-A of the assembled sealed electronic control module housing 100 of FIG. 7. In various embodiments, the sealed threaded fasteners 110 may be located within a gasket 120. In various embodiments, a molded elastomeric gasket 120 may be utilized to create a seal between the upper housing 102 and the lower housing 104 of the electronic control module housing 100. In some embodiments, the gasket 120 may be comprised of nitrile rubber. In some embodiments, the gasket 120 may comprise silicone rubber. In an example embodiment, the gasket 120 may comprise a material having a durometer rating in a range from 30 to 100 Shore A. However, other materials may used to meet the design criteria of a particular implementation. In some embodiments, the gasket 120 may be implemented as an individual component. In some embodiments, the gasket 120 may comprise a circular cross-section. In some embodiments, the gasket 120 may comprise an L-shaped cross-section. In some embodiments, the gasket 120 may be implemented as an elastomer seal that is over-molded to an adjacent component (e.g., housing, cover, etc).

In an example, the sealed threaded fasteners 110 may be inserted through the holes 106 in the lower housing 104, through holes in a circuit board 122, and into threaded sockets 124 in the upper housing 102. The sealed threaded fasteners 110 may be located within the gasket 120. Because the sealed threaded fasteners 110 are located within the gasket 120, the sealed threaded fasteners 110 generally include the sealant material 118 to prevent fluid penetration into the sealed space within the sealed electronic control module housing 100. In an example, the threaded sockets 124 in the upper housing 102 may be formed by inserting threaded inserts into holes 126 in the upper housing 102. In an example, the threaded inserts 124 may comprise metal (e.g., brass, aluminum, etc.) inserts. In an example, the threaded inserts 124 may be configured (e.g., splined, barbed, threaded, etc.) to allow the inserts to be retained in the holes 126 of the upper housing 102.

Referring to FIG. 9, a diagram is shown illustrating an enlarged view of the sealed threaded fastener 110 of the assembled sealed electronic control module housing 100 of FIG. 8 in accordance with an example embodiment of the invention. The sealed threaded fastener 110 are generally torqued until the posts 116 are in contact with the outer surface of the lower housing 104 and the specified compression force is attained. The sealant 118 generally fills any gap between the threaded shaft 114 of the sealed threaded fastener 110 and an edge of the opening 108. The sealant 118 generally also fills any gap between the head 112 of the sealed threaded fastener 110 and the outer surface of the lower housing 104.

Figure 10:
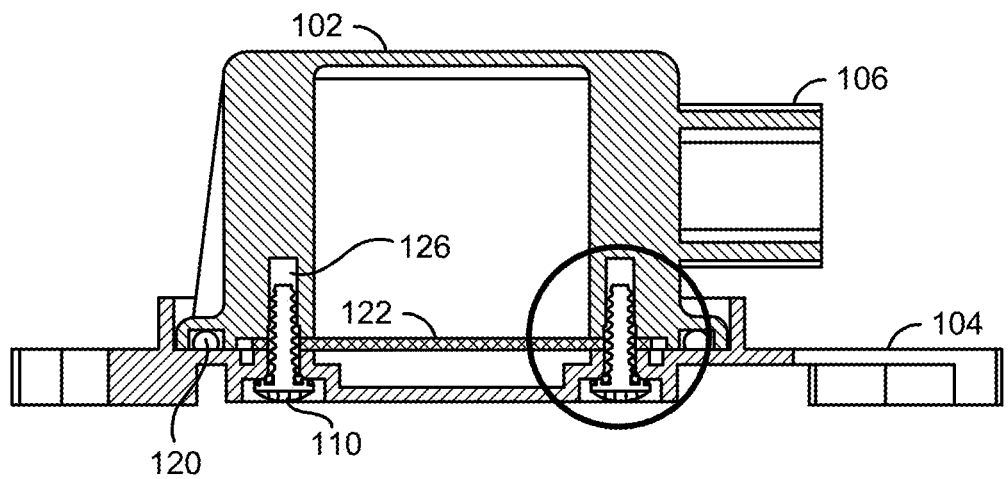
FIG. 10 is a cross-sectional view illustrating a section of the sealed electronic control module housing of FIG. 7 in accordance with another example embodiment of the invention.
Figure 11:
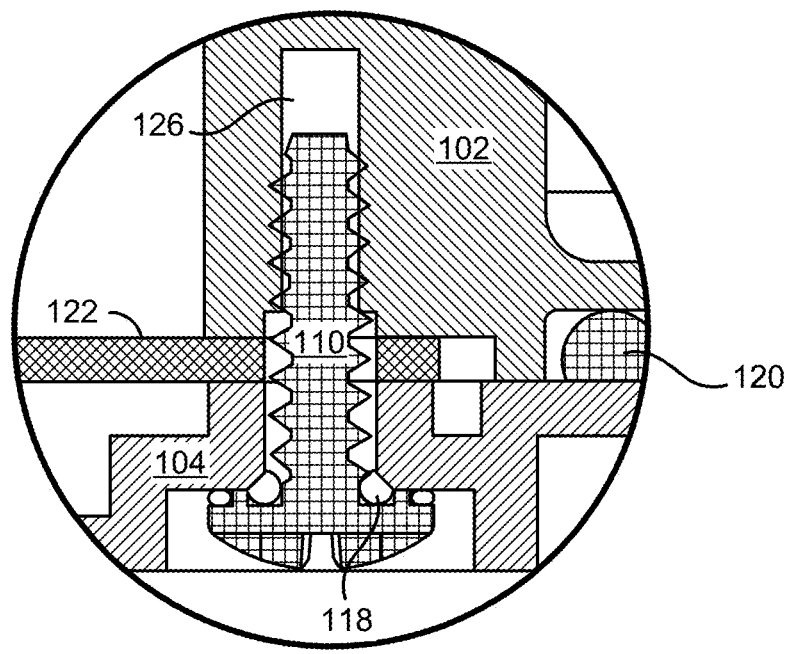
FIG. 11 is a diagram illustrating an enlarged view of another example screw fastener feature of the assembled sealed electronic control module housing of FIG. 10.

Referring to FIGS. 10 and 11, a cross-sectional view is shown illustrating a section A-A of the assembled sealed electronic control module housing 100 of FIG. 7 in accordance with another example embodiment of the invention. In various embodiments, the sealed threaded fasteners 110' may be implemented as self-threading screws. In various embodiments, the sealed threaded fasteners 110' may be located within the gasket 120. In various embodiments, a molded elastomeric gasket 120 may be utilized to create a seal between the upper housing 102 and the lower housing 104 of the electronic control module housing 100. In some embodiments, the gasket 120 may be comprised of nitrile rubber. In some embodiments, the gasket 120 may comprise silicone rubber. In an example embodiment, the gasket 120 may comprise a material having a durometer rating in a range from 30 to 100 Shore A. However, other materials may used to meet the design criteria of a particular implementation. In some embodiments, the gasket 120 may be implemented as an individual component. In some embodiments, the gasket 120 may comprise a circular cross-section. In some embodiments, the gasket 120 may comprise an L-shaped cross-section. In some embodiments, the gasket 120 may be implemented as an elastomer seal that is over molded to an adjacent component (e.g., housing, cover, etc).

In an example, the sealed threaded fasteners 110' may be implemented as self-threading screws. In an example, the sealed threaded fasteners 110' may be inserted through the holes (or openings) 108 in the lower housing 104, through holes in a circuit board 122, and into the sockets 126 in the upper housing 102. The sealed threaded fasteners 110' may be located within the gasket 120. Because the sealed threaded fasteners 110' are located within the gasket 120, the sealed threaded fasteners 110' generally include the sealant material 118 to seal the holes 108 and prevent fluid penetration into the sealed space within the sealed electronic control module housing 100. In an example, the sockets 126 in the upper housing 102 may be formed by creating non-threaded holes (or recesses) in the upper housing 102. In an example, the sealed threaded fasteners 110' may create threads when screwed into the sockets 126 in the upper housing 102.

Referring to FIG. 11, a diagram is shown illustrating an enlarged view of the sealed threaded fastener 110' of the assembled sealed electronic control module housing 100 of FIG. 10 in accordance with an example embodiment of the invention. The sealed threaded fastener 110' are generally torqued until the continuous 360 degree rib 116' is in contact with the outer surface of the lower housing 104 and the specified compression force is attained. The sealant 118 generally fills any gap between the threaded shaft 114 of the sealed threaded fastener 110' and an edge of the opening 108. The continuous 360 degree rib 116' generally contains and deflects the sealant 118 to ensure the sealant 118 fills (seals) any gap between the threaded shaft 114 of the sealed threaded fastener 110' and an edge of the opening 108. The continuous 360 degree rib 116' generally also contains and deflects the sealant 118 to ensure the sealant 118 fills (seals) any gap between the head 112' of the sealed threaded fastener 110' and the outer surface of the lower housing 104 within the space defined by the threaded shaft 114 and the continuous 360 degree rib 116' of the sealed threaded fastener 110'.

Figure 12:
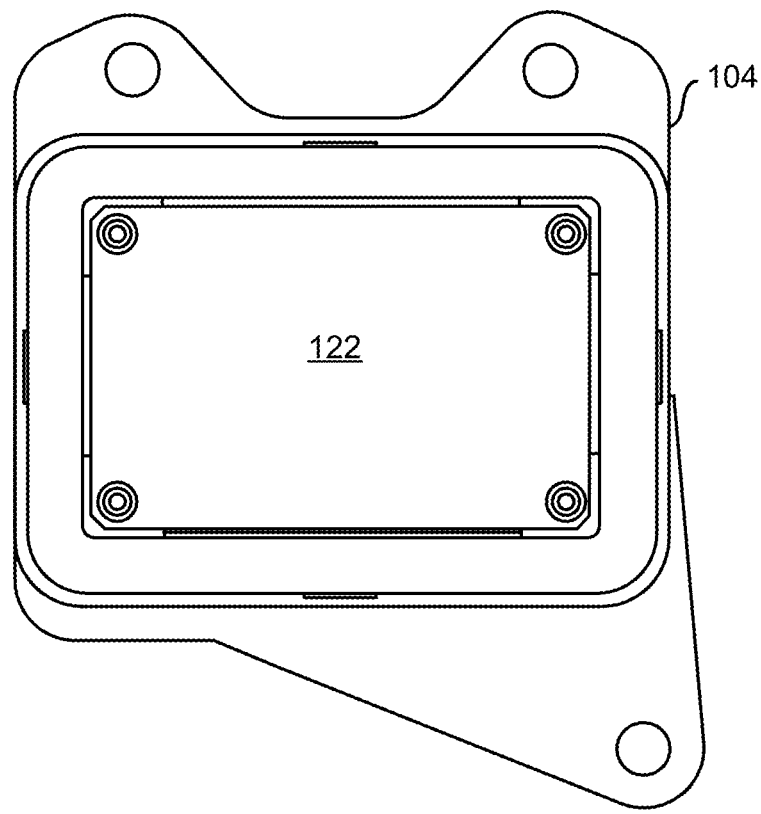
FIG. 12 is a diagram illustrating an inner surface of a lower portion of the sealed electronic control module housing of FIG. 1.

Referring to FIG. 12, a diagram is shown illustrating the circuit board 122 mounted to an inner surface of the lower housing 104 of the sealed electronic control module housing 100 of FIG. 1. In an example, the lower housing 104 may be configured to allow the circuit board 122 to be mounted to the inner surface. In an example, the lower housing 104 may comprise a number of studs to which the circuit board 122 may be configured to be press fit. The press fit may hold the circuit board 122 in position while the sealed electronic control module housing 100 is assembled and the sealed threaded fasteners are inserted and torqued.

Figure 13:
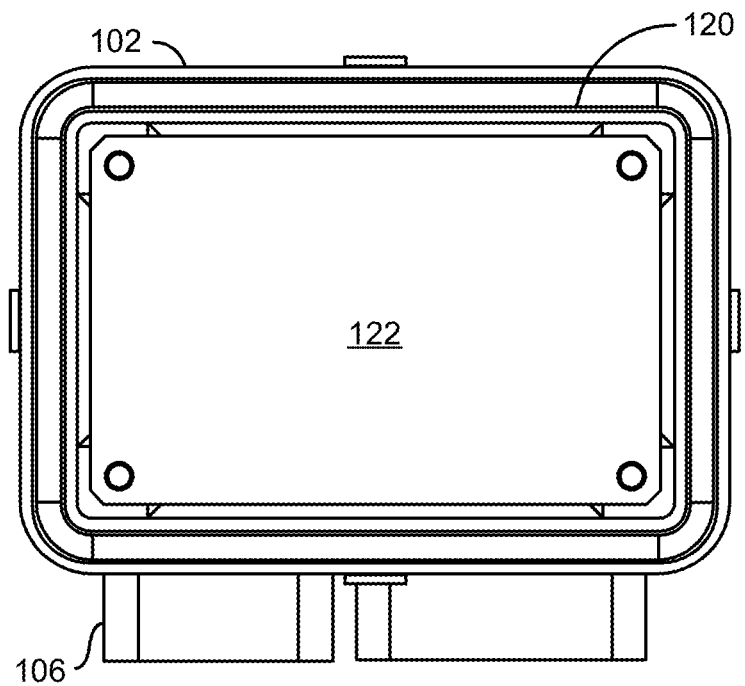
FIG. 13 is a diagram illustrating a circuit board mounted within an upper portion of the sealed electronic control module housing of FIG. 1.

Referring to FIG. 13, a diagram is shown illustrating the circuit board 122 mounted within the upper housing 102 of the sealed electronic control module housing 100 of FIG. 1. In another example, the upper housing 102 may be configured to allow the circuit board 122 to be mounted within the upper housing 102. In an example, the upper housing 102 may comprise a number of studs to which the circuit board 122 may be configured to be press fit. The press fit may hold the circuit board 122 in position in the upper housing 102 while the sealed electronic control module housing 100 is assembled and the sealed threaded fasteners 110 are inserted and torqued.

Figure 14:
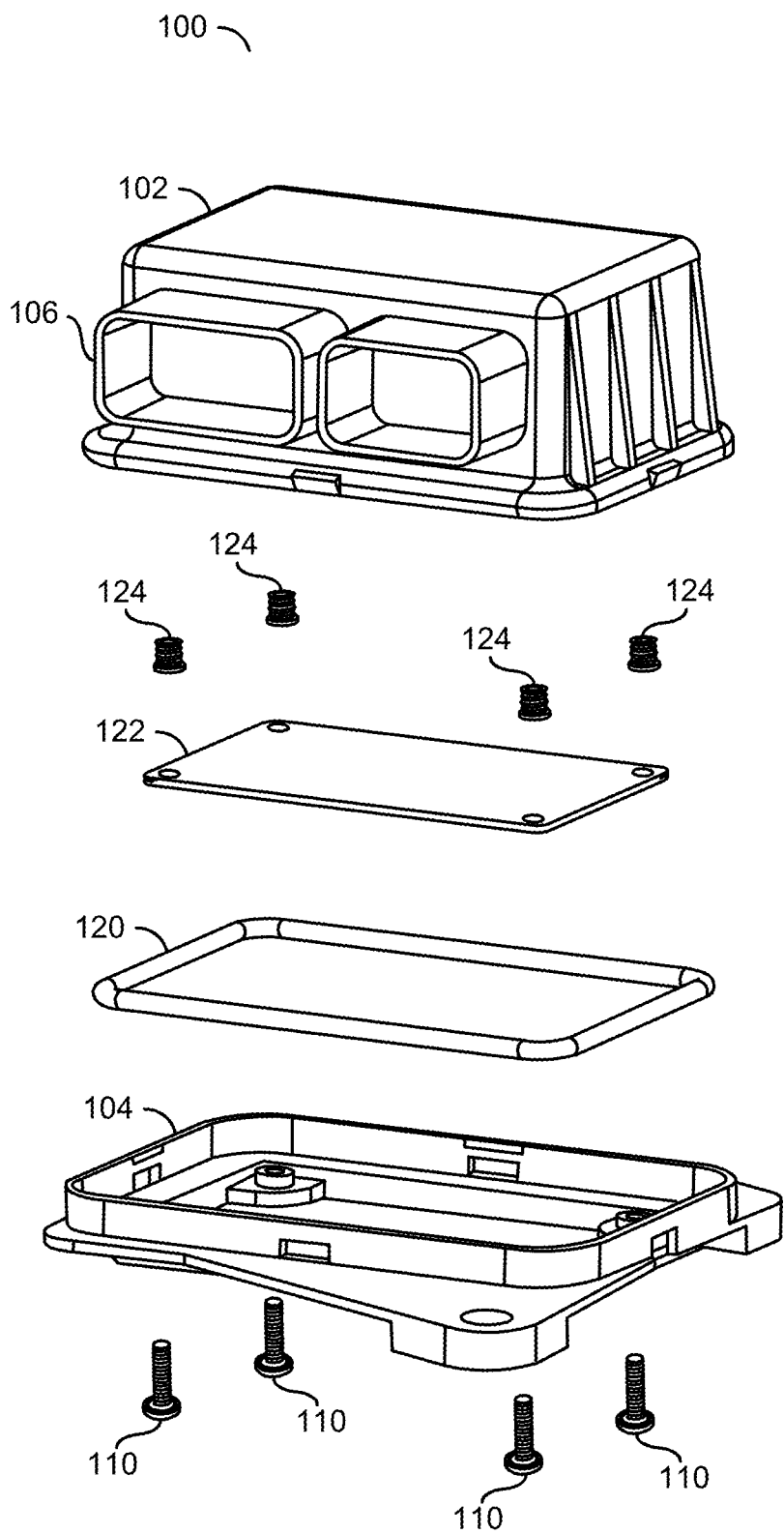
FIG. 14 is a diagram illustrating an exploded view of the sealed electronic control module housing of FIG. 7 with a circuit board.

Referring to FIG. 14, a diagram is shown illustrating an exploded view of the sealed electronic control module housing 100 of FIG. 1. In an example, assembly of the sealed electronic control module housing 100 may comprise inserting the threaded inserts 124 into the recesses 126 in the upper housing 102, attaching the circuit board 122 to either the upper housing 102 or the lower housing 104, placing the gasket 120 around the circuit board 122 (e.g., in a groove in the upper housing 102 and/or lower housing 104), assembling the upper housing 102 and lower housing 104, inserting the sealed threaded fasteners 110, and tightening the sealed threaded fasteners 110 to apply an amount of compressive force to the gasket 120 to perfect the seal provided by the sealed electronic control module housing 100. In embodiments implementing self-threading screws, the step of inserting the threaded inserts 124 may be omitted.

Figure 15:
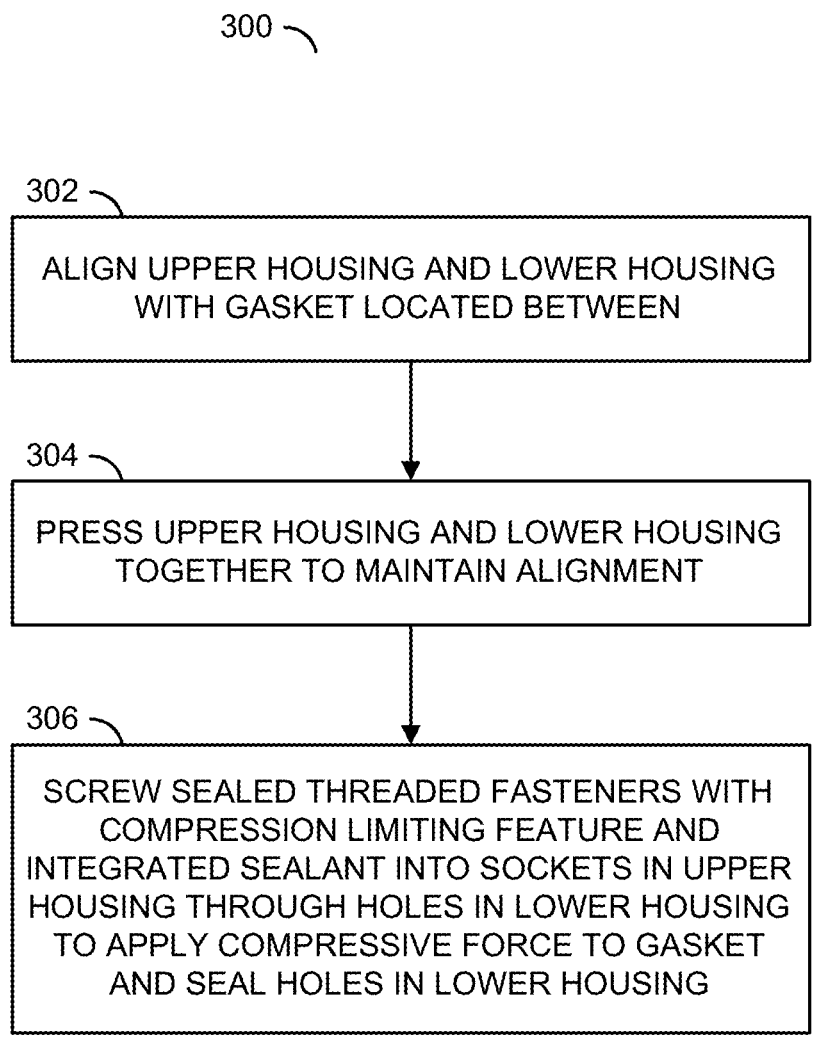
FIG. 15 is a flow diagram illustrating a manufacture process in accordance with an example embodiment of the invention.

Referring to FIG. 15, a diagram of a process 300 is shown illustrating an assembly (manufacturing) process in accordance with an example embodiment of the invention. In an example, the process (or method) 300 may comprise a step (or state) 302, a step (or state) 304, and a step (or state) 306. In the step 302, the process 300 may align an upper housing and a lower housing with a gasket placed there between for assembly together. The upper housing may comprise a plurality of threaded or unthreaded sockets and the lower housing may comprise a plurality of holes configured to align with the plurality of threaded or unthreaded sockets when assembled to the upper housing. In the step 304, the process 300 may press the upper housing and the lower housing together to hold the upper housing, the lower housing, and the gasket in a predetermined alignment for subsequent assembly steps. In the step 306, the process 300 may insert and torque a plurality of sealed threaded fasteners in accordance with an embodiment of the invention into the threaded or unthreaded sockets of the upper housing through the holes in the lower housing to apply an amount of compressive force to the gasket. The amount of compressive force applied generally perfects a seal provided by the gasket between the upper housing and the lower housing.

As described above, the gasket generally functions (when compressed in the assembly) to create a seal between components (typically a housing and a baseplate). Molding or otherwise incorporating a connector or connectors as part of the enclosure (housing) eliminates the need for sealing the connector/housing interface. Conventional sealed modules use a radially compressed sealed Restraint Control Module design which is limited to an all plastic module. In contrast, in various embodiments of the invention an axial or face seal design may be implemented, which may be used with a metal baseplate or cover and the sealed threaded fasteners to create a clamping force.

In various embodiments fasteners are located inside the seal to improve the clamping of a printed circuit board to the enclosure. Embodiments placing the fasteners inside the gasket may have a potential advantage of improving mechanical transfer function performance, at a cost, however, of the fasteners needing to also be sealed.

When an adhesive/sealant (e.g., RTV, epoxy, etc.) is used instead of a solid seal (e.g., so the head of the screw is actually adhering to the clamping surface), the sealed threaded screw with a compression limiting feature (e.g., a continuous 360 degree rib or a plurality of posts) generally form a cavity under the head of the screw. The cavity generally contains a volume of the adhesive/sealant material that may have a better chance to flex and/or expand/contract. Without the cavity under the head of the screw, only a very thin film of adhesive/sealant is generally present that may be flatten between the head of the screw and the cover/baseplate. The thin film of the adhesive/sealant will generally be prone to break during environmental testing. A film of adhesive/sealant generally has a harder time passing environmental testing than when there is some thickness to the adhesive/sealant.

The structures illustrated in the diagrams of FIGS. 1 to 15 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art (s). Appropriate software, firmware, coding, routines, instructions, opcodes, microcode, and/or program modules may readily be prepared by skilled programmers based on the teachings of the present disclosure, as will also be apparent to those skilled in the relevant art (s). The software is generally embodied in a medium or several media, for example non-transitory storage media, and may be executed by one or more of the processors sequentially or in parallel.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   an upper housing comprising a plurality of threaded sockets;
   a gasket;
   a lower housing comprising a plurality of holes configured to align with the plurality of sockets when assembled to the upper housing; and
   a plurality of sealed threaded fasteners, wherein when said upper housing is assembled to said lower housing, the sealed threaded fasteners are screwed into the threaded sockets of the upper housing through the holes in the lower housing, applying a predetermined amount of compressive force to the gasket and sealing the holes in the lower housing,
   wherein each of the plurality of sealed threaded fasteners comprises:
   a head;
   a threaded shaft extending perpendicular and away from the head;
   a compression limiting feature extending away from the head and parallel with the threaded shaft; and
   a sealant material applied to the head and encompassing the threaded shaft and the compression limiting feature.

2. The apparatus according to claim 1, wherein said sealant material is configured to form a seal between said sealed threaded fasteners and said lower housing, and said compression limiting feature extending away from the head and parallel with the threaded shaft is configured to prevent shear failure of said sealant material during an assembly operation.

3. The apparatus according to claim 2, wherein said compression limiting feature comprises either a plurality of posts or a continuous 360 degree rib extending away from the head and parallel with the threaded shaft and is configured to contact an outer surface of said lower housing prior to said shear failure of said sealant material.

4. The apparatus according to claim 1, wherein said compression limiting feature limits an amount of compression of said sealant material.

5. The apparatus according to claim 1, wherein said compression limiting feature maintains a clamping-load over time.

6. The apparatus according to claim 1, wherein said compression limiting feature maintains a clamping-load over temperature variation.

7. A sealed restraint control module comprising:
an upper housing comprising a plurality of sockets;
a gasket;
a lower housing comprising a plurality of holes configured to align with the plurality of sockets when assembled to the upper housing; and
a plurality of sealed threaded fasteners, wherein when said upper housing is assembled to said lower housing, the plurality of sealed threaded fasteners are screwed into the sockets of the upper housing through the holes in the lower housing, applying a predetermined amount of compressive force to the gasket and sealing the holes in the lower housing,
wherein each of the plurality of sealed threaded fasteners comprises:
a head;
a threaded shaft extending perpendicular and away from the head;
a compression limiting feature extending away from the head and parallel with the threaded shaft; and
a sealant material applied to the head and encompassing the threaded shaft and the compression limiting feature.

8. The sealed restraint control module according to claim 7, wherein said sealant material is configured to form a seal between said sealed threaded fasteners and said lower housing, and said compression limiting feature extending away from the head and parallel with the threaded shaft is configured to prevent shear failure of said sealant material during an assembly operation.

9. The sealed restraint control module according to claim 8, wherein said compression limiting feature extending away from the head and parallel with the threaded shaft is configured to contact said lower housing prior to said shear failure of said sealant material.

10. The sealed restraint control module according to claim 7, wherein said compression limiting feature limits an amount of compression of said sealant material.

11. The sealed restraint control module according to claim 7, wherein said compression limiting feature maintains a clamping-load over time.

12. The sealed restraint control module according to claim 7, wherein said compression limiting feature maintains a clamping-load over temperature variation.

13. A method of assembling a sealed control module housing, the method comprising the steps of:

aligning an upper housing and a lower housing with a gasket placed between for assembly together, wherein said upper housing comprises a plurality of sockets and said lower housing comprises a plurality of holes configured to align with the plurality of sockets when assembled to the upper housing; and
screwing a plurality of sealed threaded fasteners into the sockets of the upper housing through the holes in the lower housing to apply a predetermined amount of compressive force to the gasket and seal the holes in the lower housing, wherein the sealed threaded fasteners include a compression limiting feature and a sealant,
wherein each of the plurality of sealed threaded fasteners comprises:
a head;
a threaded shaft extending perpendicular and away from the head;
the compression limiting feature extending away from the head and parallel with the threaded shaft; and
the sealant applied to the head and encompassing the threaded shaft and the compression limiting feature.

14. An apparatus comprising:
an upper housing comprising a plurality of sockets, configured to receive a threaded fastener;
a gasket;
a lower housing comprising a plurality of holes configured to align with the plurality of sockets when assembled to the upper housing;
a plurality of sealed threaded fasteners, wherein when said upper housing is assembled to said lower housing, the sealed threaded fasteners are screwed into the sockets of the upper housing through the holes in the lower housing, applying a predetermined amount of compressive force to the gasket and sealing the holes in the lower housing, wherein each of the plurality of sealed threaded fasteners comprises: a head and a threaded shaft extending perpendicular and away from the head;
a compression limiting feature associated with each of the plurality of sealed threaded fasteners and extending parallel with the threaded shaft thereof; and
a sealant material encompassing the threaded shaft of each of the plurality of sealed threaded fasteners and the compression limiting feature associated therewith.

15. The apparatus according to claim 14, wherein said sealant material is configured to form a seal between said sealed threaded fasteners and said lower housing, and said compression limiting feature extending away from the head and parallel with the threaded shaft is configured to prevent shear failure of said sealant material during an assembly operation.

16. The apparatus according to claim 14, wherein said compression limiting feature limits an amount of compression of said sealant material.

17. The apparatus according to claim 14, wherein said compression limiting feature maintains a clamping-load over time.

18. The apparatus according to claim 14, wherein said compression limiting feature maintains a clamping-load over temperature variation.

* * * * *